(12) United States Patent
Cobbley

(10) Patent No.: US 6,331,221 B1
(45) Date of Patent: Dec. 18, 2001

(54) PROCESS FOR PROVIDING ELECTRICAL CONNECTION BETWEEN A SEMICONDUCTOR DIE AND A SEMICONDUCTOR DIE RECEIVING MEMBER

(75) Inventor: Chad Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/368,248

(22) Filed: Aug. 3, 1999

Related U.S. Application Data

(62) Division of application No. 09/060,740, filed on Apr. 15, 1998.

(51) Int. Cl.[7] ..................................................... H01L 23/48
(52) U.S. Cl. .................. 156/60; 29/832; 29/740
(58) Field of Search ..................... 156/297, 299, 156/60; 29/739, 740, 741, 832; 257/778, 784

(56) References Cited

U.S. PATENT DOCUMENTS

| | | | |
|---|---|---|---|
| 5,216,278 | 6/1993 | Lin et al. | 257/688 |
| 5,545,923 | 8/1996 | Barber | 257/691 |
| 5,578,874 | 11/1996 | Kurogi et al. | 257/778 |
| 5,604,383 | 2/1997 | Matsuzaki | 257/778 |
| 5,637,920 | 6/1997 | Loo | 257/700 |
| 5,973,403 * | 10/1999 | Wark | 257/777 |

\* cited by examiner

*Primary Examiner*—Michael W. Ball
*Assistant Examiner*—John T. Haran
(74) *Attorney, Agent, or Firm*—Workman, Nydegger & Seeley

(57) ABSTRACT

A semiconductor package assembly is disclosed having a semiconductor die receiving member configured to accept a semiconductor die in either the flip-chip or the wirebond orientations. First contact sites on a die receiving surface provide electrical connection with a flip-chip component. Second contact sites provide electrical connection with a wirebond component. Electrically conductive traces connect the first and second contact sites with terminal contact sites. The semiconductor package assembly may further include the flip-chip or wirebond component mounted over the die receiving surface. Further, the assembly may also include a mounting substrate in electrical connection with the terminal contact sites.

14 Claims, 5 Drawing Sheets

PROCESS FOR PROVIDING ELECTRICAL CONNECTION BETWEEN A SEMICONDUCTOR DIE AND A SEMICONDUCTOR DIE RECEIVING MEMBER

RELATED APPLICATIONS

This is a divisional patent application of U.S. patent application Ser. No. 09/060,740, titled SUBSTRATE FOR ACCEPTING WIRE BONDED OR FLIP-CHIP COMPONENTS, filed on Apr. 15, 1998, which is incorporated herein by reference.

BACKGROUND OF THE INVENTION

1. The Field of the Invention

The present invention relates to semiconductor chip packaging. More particularly, the present invention relates to semiconductor package assemblies configured to accept both flip-chip and wirebond semiconductor chips.

2. The Relevant Technology

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term "electronic component" refers to any device or structure which may be connected to and respond to an electrical power or signal source, and includes, but is not limited to, semiconductor dies, semiconductor substrates, and integrated circuits as described above.

Semiconductor dies are commonly packaged to produce devices in a form for convenient use by consumers. Packaging steps are conducted to provide signal and power distribution to and from the semiconductor die, to dissipate heat from the semiconductor die, and to physically protect the semiconductor die. There is an ongoing effort in the semiconductor industry to reduce packaging costs, to improve electrical and thermal performance, and to reduce size.

An important packaging process is that of mounting and electrically connecting a semiconductor die to a mounting substrate such as a printed circuit board. A printed circuit board has a series of internal and external printed wires for electrically connecting two or more semiconductor dies or other electronic components that are mounted or attached thereto. Commonly, a semiconductor die is mounted over a receiving member that is in turn attached to the mounting substrate. Often, the receiving member is also a printed circuit board. The receiving member has a series of internal electrically conductive traces, each of which extends between at least two contact sites. One contact site is positioned to provide electrical connection with a bond pad on the semiconductor die, while the other contact site is located so as to provide electrical connection with the mounting substrate. Thus, a semiconductor package assembly formed according to the above-described process includes a semiconductor die mounted over a receiving member, which is in turn attached to a mounting substrate.

Semiconductor dies are structured according to one of at least two available designs: wirebond and flip-chip. Wirebond semiconductor dies have a set of bond pads arrayed on a face thereof. These semiconductor dies are packaged on a mounting substrate such that the face having the bond pads faces away from the receiving member and the mounting substrate. The bond pads are then wired to corresponding contact sites on the receiving member. In contrast, the bond pads of a flip-chip semiconductor die are arrayed on the opposite face. The face of a flip-chip that has the bond pads is disposed directly on the receiving member. An array of solder balls or other conductive material provides electrical connection between the bond pads of the flip-chip and the contact sites of the receiving member.

Manufacturers may find it commercially desirable to produce any specific integrated circuit according to both the wirebond and flip-chip designs. For example, one customer may demand a flip-chip, while another customer may be satisfied with a wirebond semiconductor die. However, such dual design of integrated circuits has required two corresponding receiving members, one configured to receive a flip-chip, and the other to receive the wirebond semiconductor die. Dual design of receiving members is expensive for the manufacturer—it requires increased inventory and redundant design and effort. The cost of producing and keeping in inventory dual receiving members may make production of dually designed integrated circuits prohibitive, thereby preventing market demand from being satisfied. It will be appreciated that a receiving member that is capable of receiving either a flip-chip or a wirebond semiconductor die, as needed, would be advantageous.

SUMMARY OF THE INVENTION

The present invention is directed to a semiconductor package assembly that is configured to include or receive either a flip-chip or a wirebond semiconductor die. According to the invention, one receiving member design is sufficient to provide packaging for both the flip-chip and wirebond designs of a semiconductor die. Thus, a single receiving member can be used with either a flip-chip or wirebond semiconductor die according to customer demand or other design constraints. Various embodiments of the invention include a receiving member alone or a receiving member in combination with one or both of a mounting substrate and an electronic component.

The receiving member according to the invention has a component receiving surface with a component receiving region thereon. The component receiving region is configured to receive an electronic component. The component receiving region is defined and bounded by a perimeter that corresponds to the periphery of the electronic component. Accordingly, an electronic component mounted over a component receiving surface will be aligned with and substantially positioned over the component receiving region.

According to a preferred embodiment of the invention, a plurality of first contact sites and a plurality of second contact sites are arrayed on the component receiving surface. The first contact sites are positioned within the perimeter of the component receiving region, and provide electrical connection with the bond pads of a flip-chip. The second contact sites are positioned outside of the perimeter, and provide electrical connection with the bond pads of a wirebond electronic component. Electrically conductive traces within the receiving member connect the first contact sites and the second contact sites with terminal contact sites positioned on a surface of the receiving member. Each trace connects one corresponding first contact site, one corresponding second contact site, and one corresponding terminal contact site.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

According to the present invention, a semiconductor package assembly is provided that is configured to accept or include either of a flip-chip or a wirebond semiconductor die. In one embodiment of the invention, a receiving member is capable of receiving a semiconductor die in either a flip-chip or wirebond orientation. In a further embodiment, the assembly includes the receiving member attached to a semiconductor die in either the flip-chip or wirebond orientation.

Figure 1:
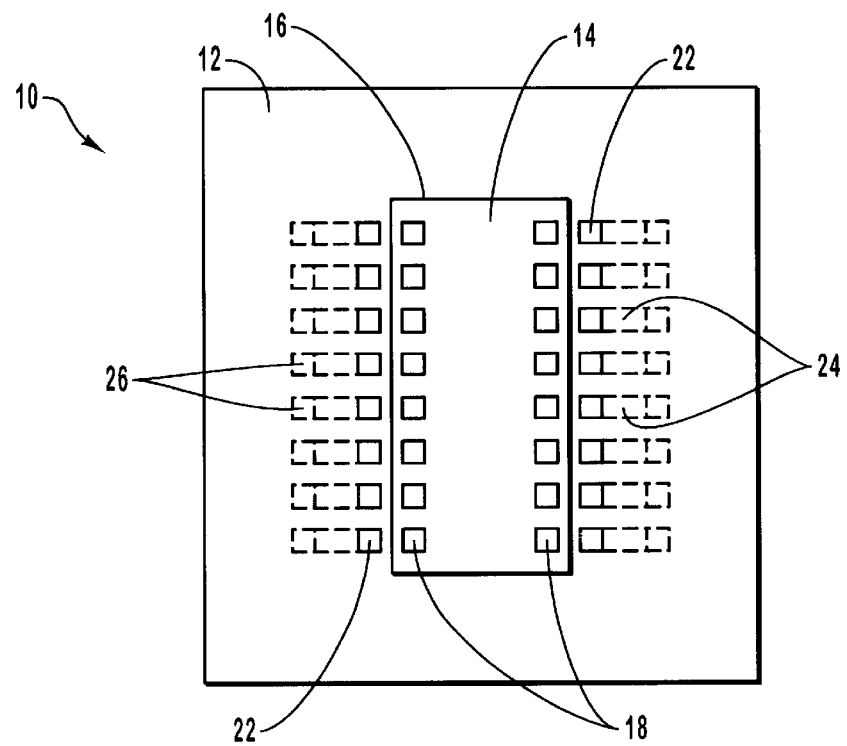
FIG. 1 is a top view of a receiving member configured for receiving an electronic component.

Shown in FIG. 1 is a semiconductor die receiving member 10 in a first embodiment. Semiconductor die receiving member 10 has a die receiving surface 12 configured to accept a semiconductor die, an integrated circuit wafer, or another electronic component. The receiving members of the invention are particularly useful for mounting semiconductor dies, but other electronic components that are conventionally mounted over receiving members are contemplated by the invention. Accordingly, semiconductor die receiving member 10 is disclosed herein as a preferred embodiment, but it will be understood that the invention extends to other receiving members configured to accept other electronic components.

A semiconductor die that is to be mounted over semiconductor die receiving member 10 would be positioned over die receiving region 14 of die receiving surface 12. Die receiving region 14 is bounded and defined by a perimeter 16 that corresponds to and has substantially the same dimensions as the periphery of the semiconductor die with which semiconductor die receiving member 10 is to be used. Thus, semiconductor die receiving member 10 is configured to receive a semiconductor die that can be positioned over die receiving region 14, thereby substantially covering die receiving region 14.

As seen in FIG. 1, a plurality of first contact sites 18 are arrayed on die receiving surface 12. Preferably, first contact sites 18 are positioned within perimeter 16. Further, a plurality of second contact sites 22 are arrayed on die receiving surface 12, preferably outside of perimeter 16. First and second contact sites 18 and 22 are located on semiconductor die receiving member 10 to provide electrical connection with a mounted semiconductor die in the flip-chip and wirebond orientations, respectively. In FIG. 1, it can be seen that first contact sites 18 are configured to lie underneath a semiconductor die when the die is proximate die receiving region 14. Moreover, second contact sites 22 are configured to lie adjacent a semiconductor die when the die is proximate die receiving region 14. However, the invention also extends to all configurations wherein contact sites 18 and 22 are situated on semiconductor die receiving member in an arrangement whereby electrical connection may be established with a mounted flip-chip component through first contact sites 18 and with a mounted wirebond component through second contact sites 22.

A plurality of electrically conductive traces 24 (shown in phantom) are contained within semiconductor die receiving member 10. Traces 24 electrically connect first contact sites 18 with second contact sites 22. Each trace 24 corresponds with one of first contact sites 18 and with one of second contact sites 22 such that each first contact site 18 is electrically connected with exactly one second contact site 22 and vice versa. Further, traces 24 are routed through semiconductor die receiving member 10 to a plurality of terminal contact sites 26 (shown in phantom) positioned on an external circuitry receiving region of semiconductor die receiving member 10. Again, each trace 24 corresponds with one of terminal contact sites 26 such that each terminal contact site 26 is electrically connected with exactly one trace 24. Traces 24 are insulated from the external environment and one from another by dielectric material contained in semiconductor die receiving member 10. Terminal contact sites 26 are intended to provide electrical connection between semiconductor die receiving member 10 and external circuitry. Accordingly, terminal contact sites 26 are positioned on any surface of semiconductor die receiving member 10 to which an electronic component or a device or structure having circuitry may be connected. As seen in FIG. 1, the first preferred embodiment of semiconductor die receiving member 10 has terminal contact sites 26 that are exposed on a surface opposite die receiving surface 12.

Semiconductor die receiving member 10 functions to provide power and signal distribution to and from semiconductor dies mounted thereon and to give rigidity to packaged semiconductor structures. Semiconductor die receiving member 10 may be any structure, including multilayer structures, through which traces 24 may be routed between contact sites 18, 22 and 26. It will be recognized by those skilled in the relevant art that a wide variety of materials may be used in semiconductor die receiving member 10. For example, printed circuit boards are currently widely used as semiconductor die receiving members. Other suitable structures include, but are not limited to, fiberglass structures and multilayer ceramics, such as those containing alumina ceramic. Moreover, semiconductor die receiving member 10 may be a semiconductor substrate, such as a selectively doped silicon wafer, silicon on insulator, silicon on sapphire, or the like.

Semiconductor die receiving member 10 is produced according to known methods of printing or constructing conductive wiring and layers within a dielectric or semiconductor substrate. For example, semiconductor die receiving member 10 may contain a series of vias, through-holes and deposited metal traces. The dimensions of semiconductor die receiving member 10 depend on the application in which it is to be used. Often, however, it will be preferable for semiconductor die receiving member 10 to be a relatively thin, laminar structure, thereby keeping package size to a minimum.

Contact sites 18, 22 and 26 are electrically conductive surfaces to which circuitry within semiconductor dies or external devices or structures may be connected. Contact sites 18, 22 and 26 may be exposed on semiconductor die receiving member 10 flush with the surface, such as die receiving surface 12, on which they are positioned. Alternatively, contact sites 18, 22 and 26 may be recessed from the surface of semiconductor die receiving member 10 through which they are exposed, in which case they may be merely exposed surfaces of traces 24. In still an alternate form, contact sites 18, 22 and 26 may protrude beyond the surface of semiconductor die receiving member 10 on which they are exposed.

Semiconductor die receiving member 10 may be configured to mount to a mounting substrate, thereby providing electrical connection between terminal contact sites 26 and external circuitry. Alternatively, semiconductor die receiving member 10 may contain a plurality of die receiving regions 14, such that more than one semiconductor die may be mounted thereon. In one variation on this alternative, semiconductor die receiving member 10 would be mounted over a mounting substrate such that each semiconductor die is electrically connected with the mounting substrate. In such an embodiment, semiconductor die receiving member 10 would have pluralities of third, fourth, etc., contact sites to correspond with the multiple die receiving regions.

In another variation on the multiple semiconductor die embodiment, semiconductor die receiving member 10 may provide for direct electrical interconnection between semiconductor dies mounted thereon, without use of a separate mounting substrate. For example, semiconductor die receiving member 10 may be a printed circuit board, such as a motherboard, designed to accept several semiconductor dies. In such an embodiment, a first die receiving region would be associated with first contact site 18 and second contact site 22. A second die receiving region would be associated with at least a third contact site. Trace 24 would lead directly from contact sites 18 and 22 to the third contact site, thereby electrically connecting the first and second semiconductor dies.

Figure 2:
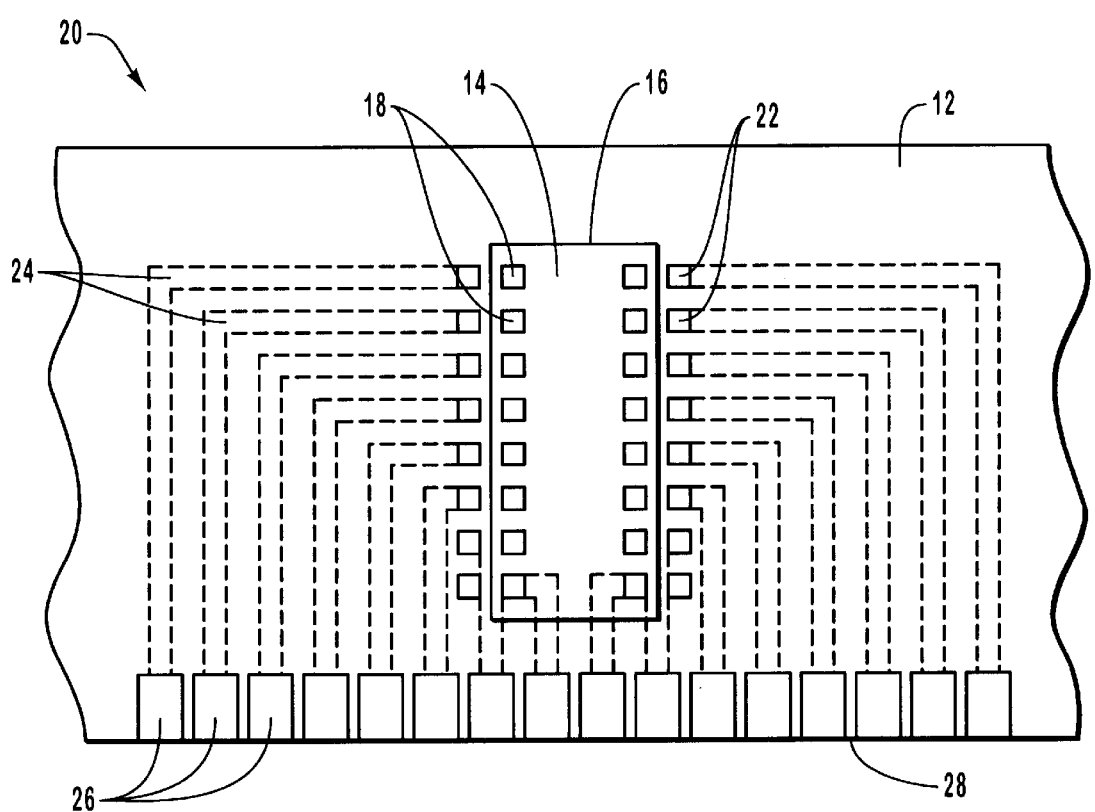
FIG. 2 is a top view of another receiving member configured for receiving an electronic component.

As shown in FIG. 2, semiconductor die receiving member 20 is a second embodiment of a structure according to the invention. Semiconductor die receiving member 20 is substantially configured as is semiconductor die receiving member 10 of FIG. 1, differing primarily in the relative arrangement of terminal contact sites 26 and electrically conductive traces 24 with die receiving region 14. Terminal contact sites 26 are arrayed along a package mount edge 28 that is laterally adjacent to die receiving surface 12.

Figure 3:
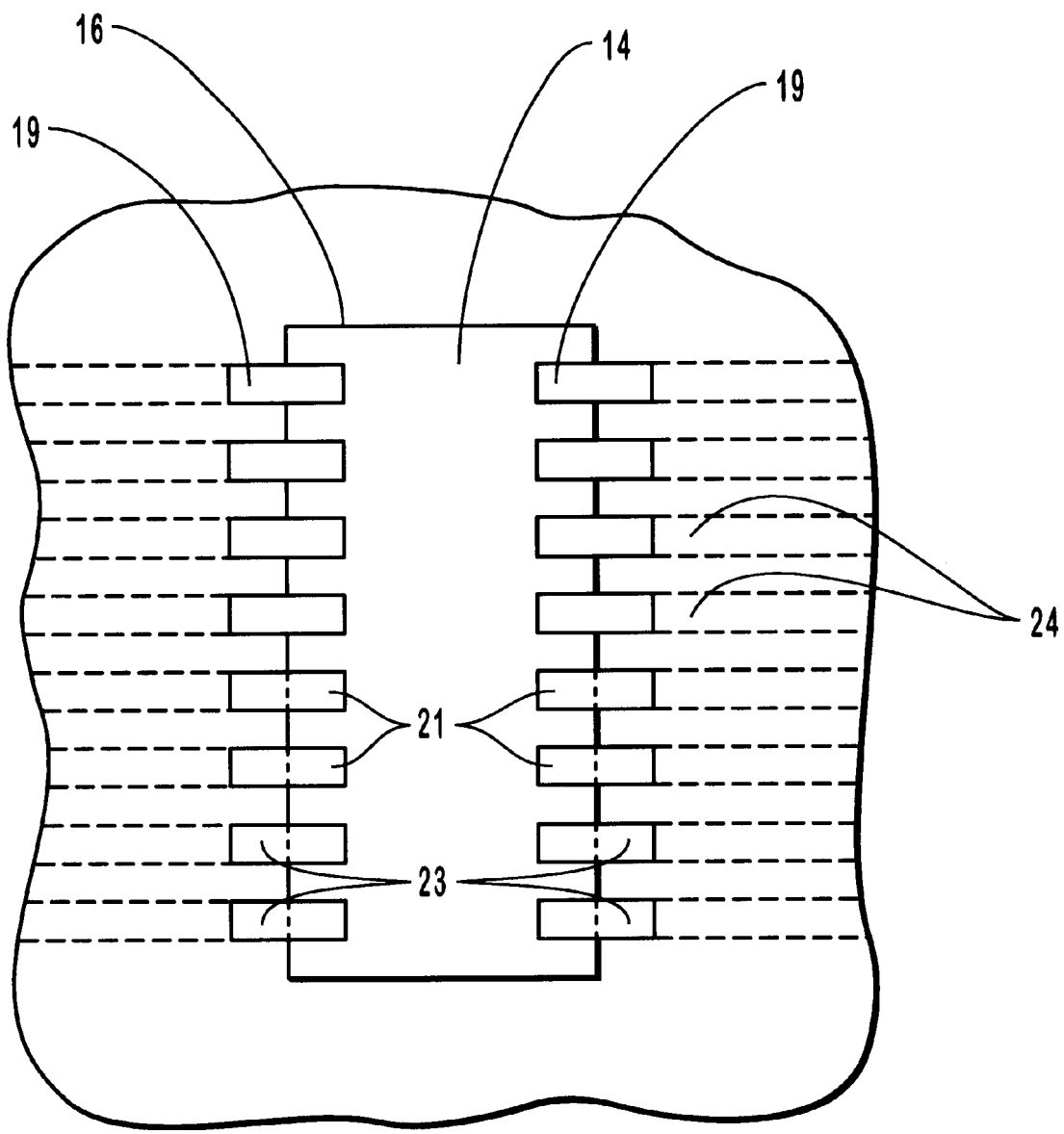
FIG. 3 is a top view of the receiving member of either FIG. 1 or FIG. 2, wherein a plurality of first contact sites and a plurality of second contact sites are replaced with contact sites that may be used with either wirebond or flip-chip components.

FIG. 3 shows an alternative embodiment of the receiving member of the present invention. In this embodiment, the plurality of first contact sites 18 and the plurality of second contact sites 22 of FIGS. 1 and 2 are combined, thereby providing a plurality of dual-purpose contact sites 19. In effect, dual-purpose contact sites 19 are provided by increasing the a real extent of and merging first contact sites 18 and second contact sites 22. Dual-purpose contact sites 19 each have a first portion 21 positioned within perimeter 16 and a second portion 23 outside of perimeter 16. When a semiconductor die is mounted over die receiving region 14 in a flip-chip orientation, electrical connection to the semiconductor die is provided by first portion 21. When a semiconductor die is mounted over die receiving region 14 in a wirebond orientation, electrical connection to the semiconductor die is provided by second portion 23. Accordingly, dual-purpose contact sites 19 are configured to provide electrical connection with a semiconductor die whether in a flip-chip or wirebond mounting orientation.

Figure 4:
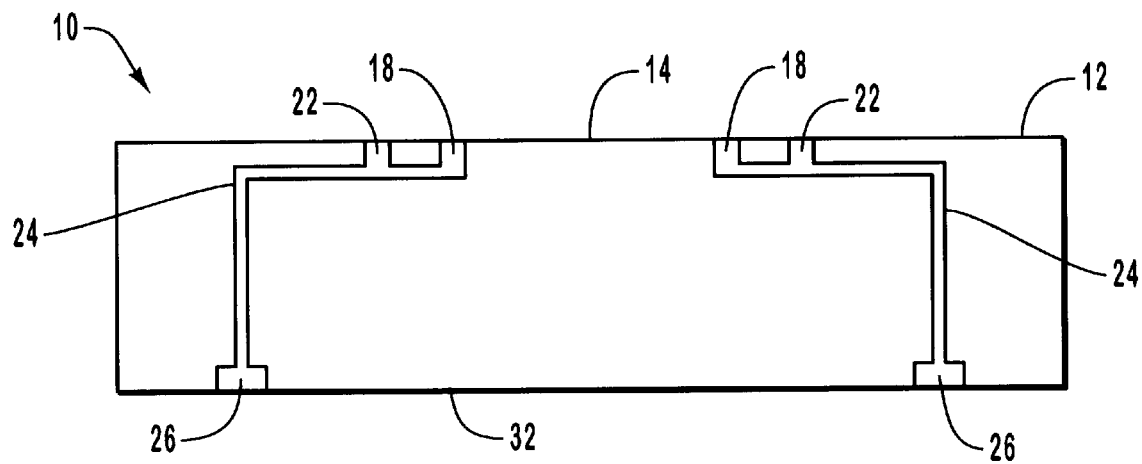
FIG. 4 is a cross section elevation view of the receiving member of FIG. 1.

FIG. 4 illustrates semiconductor die receiving member 10 of FIG. 1 in cross section elevation view. As can be seen, terminal contact sites 26 emerge to a package mount surface 32 opposite die receiving surface 12. Traces 24 allow electrical current and signals to pass between die receiving surface 12 and package mount surface 32.

Figure 5:
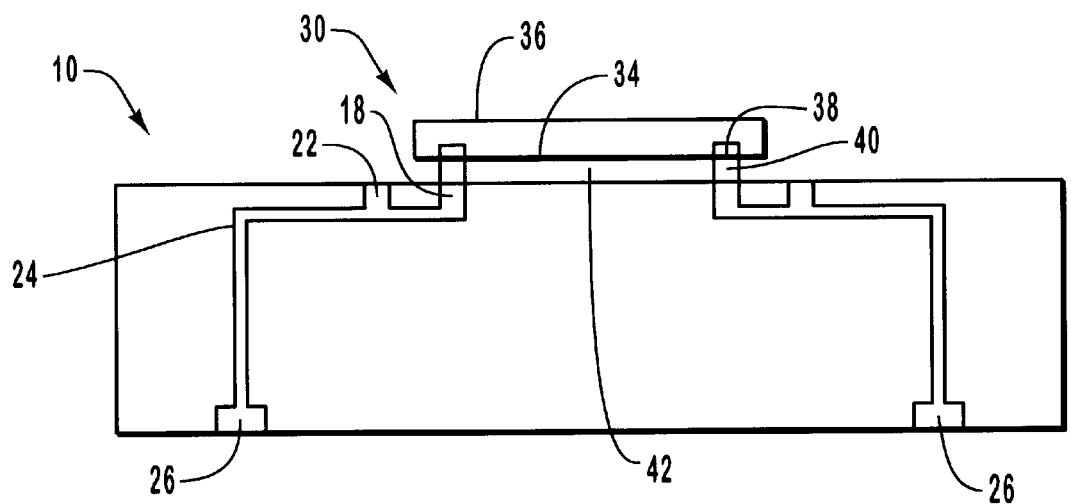
FIG. 5 is a cross section elevation view of a semiconductor package assembly including the receiving member of FIG. 1 in combination with an electronic component in the flip-chip orientation.

Referring to FIGS. 4 and 5, a semiconductor package assembly is shown according to the invention, including semiconductor die receiving member 10 of FIG. 1 in combination with one of two semiconductor dies: flip-chip semiconductor die 30 and wirebond semiconductor die 50. Semiconductor dies 30 and 50, which may be memory or logic chips, represent two alternative methods of configuring a semiconductor die for connection with external circuitry. Flip-chips are designed with bond pads arranged such that they may be placed in direct contact with contact sites of a semiconductor die receiving member. The face of a flip-chip that contains bond pads is disposed on the die receiving surface. In contrast, wirebond semiconductor dies have bond pads on the opposite surface. A wirebond component is packaged such that the face having bond pads faces away from its semiconductor die receiving member. Wires are bonded between the bond pads and corresponding contact sites on the semiconductor die receiving member.

Seen in FIG. 5 is a connection between semiconductor die receiving member 10 and flip-chip semiconductor die 30. Semiconductor die 30 has a first face 34 and an opposite second face 36. A plurality of bond pads 38 are arrayed on first face 34. First face 34 is disposed over die receiving region 14, such that bond pads 38 are aligned with corresponding first contact sites 18. A conductive material 40 is provided between bond pads 38 and contact sites 18 to facilitate electrical connection therebetween. Conductive material 40 may be solder balls, conductive polymer balls, or other suitable conductive material. A dielectric adhesive underfill is preferably applied between first surface 34 and die receiving region 14 to securely attach semiconductor die 30 to semiconductor die receiving member 10. Accordingly, semiconductor die 30 is attached to semiconductor die receiving member 10 in the flip-chip orientation, which will also be termed "first orientation" hereinafter. Electrical connection is provided from bond pad 38 through conductive material 40, first contact site 18, and trace 24, to terminal contact site 26.

Figure 6:
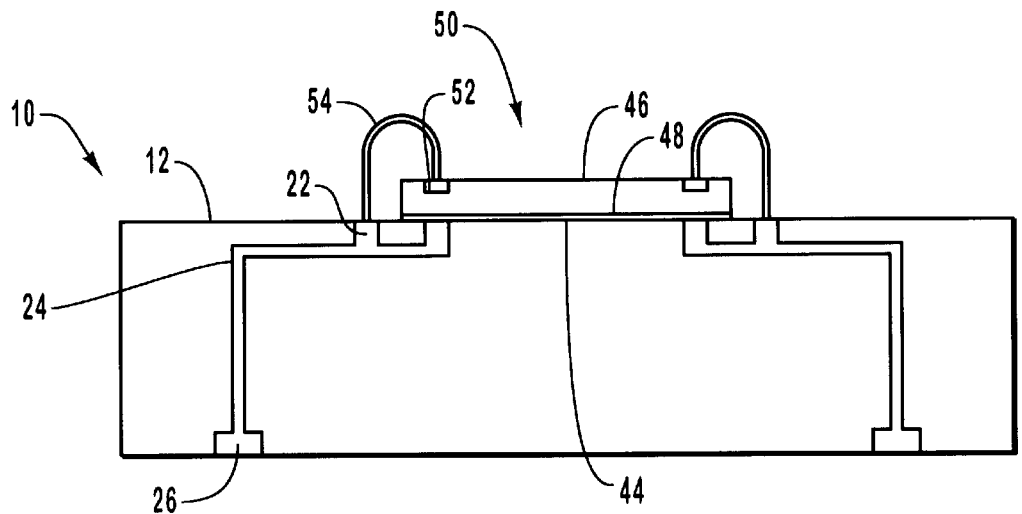
FIG. 6 is a cross section elevation view of a semiconductor package assembly including the receiving member of FIG. 1 in combination with an electronic component in the wirebond orientation.

FIG. 6 depicts semiconductor die receiving member 10 in combination with wirebond semiconductor die 50. Semiconductor die 50 has a first face 46 and an opposite second face 48. A plurality of bond pads 52 are arrayed on first face 46. In this embodiment, semiconductor die receiving member 10 includes a thin adhesive layer 44 disposed on a portion of die receiving region 14. Adhesive layer 44 is relatively thin in comparison with the thickness of semiconductor die 50. Second face 48 is disposed directly on adhesive layer 44 to cause a bond to form therebetween. Wiring 54 is extended between bond pads 52 and second contact sites 22 according to methods known in the art. Thus, semiconductor die 50 is attached to semiconductor die receiving member 10 in the wirebond orientation, which will also be termed "second orientation" hereinafter. Electrical connection is thereby provided from bond pad 52, through wiring 54, second contact site 22, and trace 24, to terminal contact site 26.

It will be understood that semiconductor die receiving member 20 as illustrated in FIG. 2 is also configured to receive semiconductor dies 30 and 50 of the respective flip-chip and wirebond designs. Semiconductor dies 30 and 50 may be attached to semiconductor die receiving member 20 as described above in reference to FIGS. 4 and 5. Accordingly, semiconductor package assemblies are provided under the present invention having semiconductor die receiving member 20 in combination with either of semiconductor die 30 or semiconductor die 50.

Figure 7:
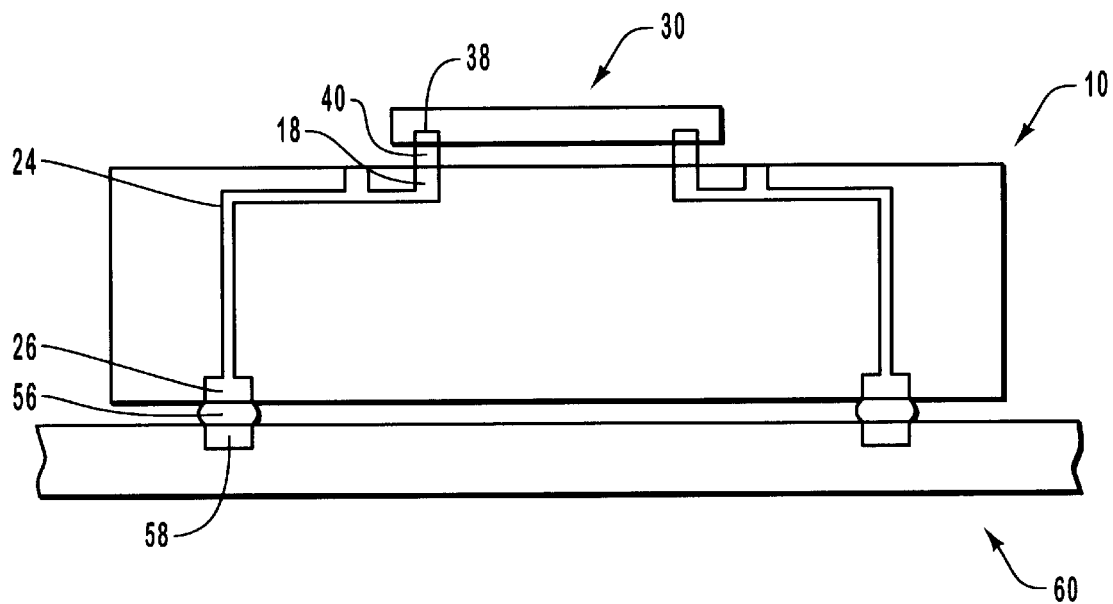
FIG. 7 is a cross section elevation view of the semiconductor package assembly of FIG. 5 attached to a mounting substrate.

Turning to FIG. 7, a semiconductor package assembly as described above in reference to FIG. 5 is provided, with the addition of mounting substrate 60 on which semiconductor die receiving member 10 is mounted. As discussed above, the semiconductor package assembly provides electrical connection between bond pad 38 and terminal contact site 26. Inclusion of mounting substrate 60 in the semiconductor package assembly allows electrical connection to extend to external circuitry contained in any chosen component, device or structure. Mounting substrate 60 has a plurality of contact pads 58 positioned to correspond to the plurality of terminal contact sites 26. Semiconductor die receiving member 10 is disposed over mounting substrate 60 so as to align terminal contact sites 26 with corresponding contact pads 58. Semiconductor die receiving member 10 is thereby positioned parallel to mounting substrate 60. A conductive material 56 is provided at the interface between terminal contact sites 26 and contact pads 58 to establish electrical connection therebetween. An adhesive material (not shown) optionally may be used to strengthen the bond between semiconductor die receiving member 10 and mounting substrate 60.

Mounting substrate 60 is commonly a printed circuit board. For example, semiconductor die receiving member 10 may be mounted over a printed circuit motherboard. However, it will be recognized by those skilled in the relevant art that a wide variety of structures and materials may serve as a mounting substrate 60. Other suitable structures include, but are not limited to, fiberglass structures and multilayer ceramics, such as those containing alumina ceramic. Moreover, mounting substrate 60 may be a semiconductor substrate, such as a selectively doped silicon wafer, silicon on insulator, silicon on sapphire, or the like.

Mounting substrate 60 is produced according to appropriate known methods, such as printing or otherwise constructing conductive wiring and layers within a dielectric or semiconductor substrate. The dimensions of mounting substrate 60 depend on the application in which it is to be used. Often, however, it will be preferable for mounting substrate 60 to be a relatively thin, laminar structure, thereby keeping package size to a minimum. A plurality of semiconductor die receiving members 10, with their corresponding semiconductor dies, may be mounted over a mounting substrate, thereby providing communication and coordination between two or more semiconductor dies.

Figure 8:
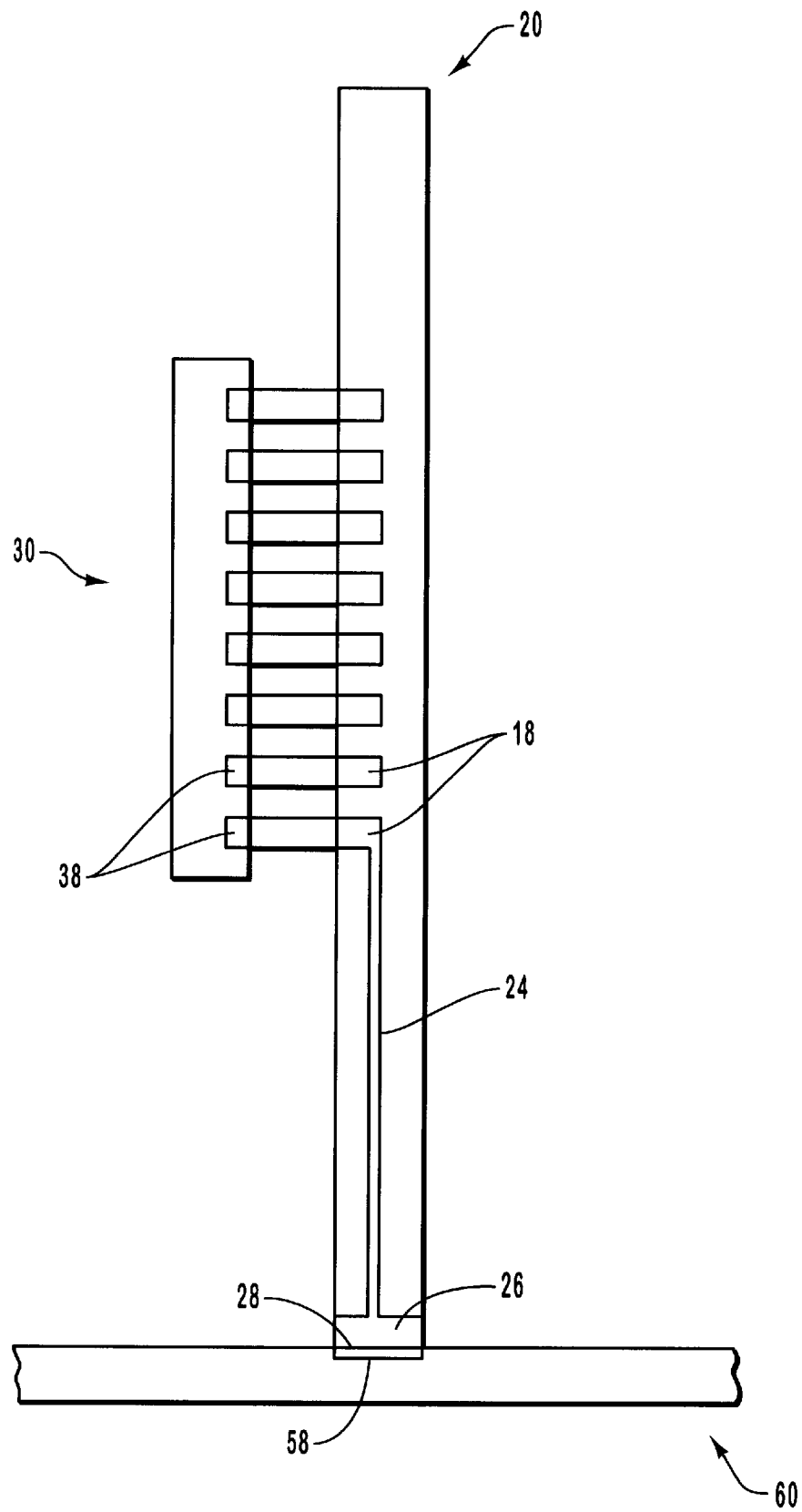
FIG. 8 is a cross section elevation view of a semiconductor package assembly including the receiving member of FIG. 2 in combination with an electronic component and attached to a mounting substrate.

Referring to FIG. 8, a semiconductor package assembly in a further embodiment is shown, including semiconductor die receiving member 20, semiconductor die 30 in the flip-chip orientation, and mounting substrate 60. Alternatively, semiconductor die 50 in the wirebond orientation can be substituted for semiconductor die 30 in the flip-chip orientation. Mounting substrate 60 has a plurality of contact pads 58 that correspond to terminal contact sites 26. Semiconductor die receiving member 20, with mounted semiconductor die 30, is positioned so that package mount edge 28 is positioned over mounting substrate 60, with terminal contact sites 26 being aligned with corresponding contact pads 58. Semiconductor die receiving member 20 is conductively attached to mounting substrate 60 such that a conductive interface is formed between terminal contact sites 26 and contact pads 58. Semiconductor die receiving member 20 is thereby positioned substantially orthogonal relative to mounting substrate 60. Alternatively, semiconductor die receiving member 20 may connect with mounting substrate 60 in an oblique angle. In this embodiment, mounting substrate 60 in FIG. 8 may be any structure or material as described above in reference to mounting substrate 60 in FIG. 7.

The semiconductor package assembly as described above in reference to FIG. 8 is commonly known as a card-on-board assembly, where mounting substrate 60 is a board, or motherboard, and semiconductor die receiving member 20 is a card, or a "daughter-board". The card-on-board assembly is especially useful for efficiently packaging memory chips, whereas logic chips are more frequently packaged according to the assembly described above in reference to semiconductor die receiving member 10.

According to the above described and other embodiments, a versatile semiconductor die receiving member and associated semiconductor package assembly are disclosed. The assembly accepts semiconductor dies in either the flip-chip or wirebond orientation. Moreover, the semiconductor die receiving member may be attached to a mounting substrate in a parallel or orthogonal orientation.

The present invention has application to a wide variety of semiconductor packaging assemblies other than those specifically described herein. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for providing electrical connection between a semiconductor die and a semiconductor die receiving member, said process comprising:

providing said semiconductor die receiving member, wherein said semiconductor die receiving member is capable of receiving a respective semiconductor die which can be mounted either through flip-chip mounting or wirebonding and includes:

a plurality of first contact sites configured to lie underneath said semiconductor die when said semiconductor die is proximate said die receiving member; and a plurality of second contact sites configured to lie adjacent said semiconductor die when said semiconductor die is proximate said die receiving member, each first contact site of said plurality of first contact sites being in electrical connection with an adjacent second contact site of said plurality of second contact sites;

providing said semiconductor die, wherein said semiconductor includes a first face, an opposite second face, and a plurality of bond pads on said first face capable of flip-chip mounting or wirebonding; and mounting said semiconductor die onto said semiconductor die receiving member in one of:
   flip-chip mounting, wherein said flip-chip mounting comprises:
      disposing said first face proximate said die receiving member; and
      electrically connecting each of said plurality of bond pads with a corresponding first contact site of said plurality of first contact sites; and
   wirebonding, wherein said wirebonding comprises:
      disposing said second face proximate said die receiving member; and
      electrically connecting each of said plurality of bond pads with a corresponding second contact site of said plurality of second contact sites.

2. A process as recited in claim 1, wherein electrically connecting each of said plurality of bond pads comprises placing conductive material between each of said plurality of bond pads and said corresponding contact sites of said plurality of first contact sites.

3. A process as recited in claim 1, further comprising, after electrically connecting each of said plurality of bond pads, applying an adhesive underfill between said first face and said die receiving region.

4. A process as recited in claim 1, wherein said wirebonding further comprises, prior to disposing said second face proximate said die receiving member, providing an adhesive layer on said die receiving member.

5. A process as recited in claim 1, further comprising placing said semiconductor die receiving member in electrical connection with external circuitry.

6. A process as recited in claim 5, wherein said external circuitry is a motherboard.

7. A process for providing electrical connection between a semiconductor die and a semiconductor die receiving member, said process comprising:
   providing a semiconductor die having a first face, a second face opposite said first face, a periphery, and a plurality of bond pads arrayed on said first face capable of flip-chip mounting or wirebonding;
   providing a semiconductor die receiving member capable of receiving a respective semiconductor die which can be mounted either through flip-chip mounting or wirebonding and including:
      a die receiving surface having a die receiving region bounded by a perimeter which corresponds to and is defined by said periphery of said semiconductor die, said die receiving region being configured so as to receive said semiconductor die;
      a package mount surface;
      a plurality of first contact sites positioned on said die receiving surface substantially within said perimeter, each of said first contact sites corresponding to one of said bond pads;
      a plurality of second contact sites positioned on said die receiving surface substantially outside said perimeter, each of said second contact sites corresponding to one of said bond pads;
      a plurality of terminal contact sites on said package mount surface; and
      a plurality of electrically conductive traces, each electrically conductive trace corresponding to one of said terminal contact sites, one of said first contact sites, and one of said second contact sites which is adjacent to said one of said first contact sites, and providing electrical connection therebetween; and
   mounting said semiconductor die onto said die receiving region, said semiconductor die being mounted according to one of:
      a flip-chip mounting process including:
         disposing said first face onto said die receiving region;
         electrically connecting each bond pad to said first contact site that corresponds thereto; and
         applying an adhesive underfill between said first face and said die receiving region; and
      a wirebonding process including:
         disposing said second face onto said die receiving region; and
         electrically connecting each bond pad to said first contact site that corresponds thereto.

8. A process as recited in claim 7, wherein electrically connecting each bond pad to said first contact site that corresponds thereto comprises interposing a conductive material between each bond pad and said first contact site that corresponds thereto.

9. A process as recited in claim 7, wherein electrically connecting each bond pad to said second contact site that corresponds thereto comprises wirebonding each bond pad to said second contact site that corresponds thereto.

10. A process as recited in claim 7, further comprising:
   providing a mounting substrate having a plurality of contact pads; and
   mounting said semiconductor die receiving member over said mounting substrate, including:
      positioning said semiconductor die receiving member over said mounting substrate such that said package mount surface is disposed over said mounting substrate; and
      establishing electrical connection between each of said terminal contact sites and one of said contact pads that corresponds thereto.

11. A process as recited in claim 10, wherein positioning said semiconductor die receiving member over said mounting substrate comprises aligning said semiconductor die receiving member such that said die receiving surface is substantially orthogonal to said mounting substrate.

12. A process as recited in claim 10, wherein positioning said semiconductor die receiving member over said mounting substrate comprises aligning said semiconductor die receiving member such that said die receiving surface is substantially parallel to said mounting substrate.

13. A process for providing electrical connection between a semiconductor die and a semiconductor die receiving member, said process comprising:
   providing said semiconductor die receiving member, wherein said semiconductor die receiving member is capable of receiving a respective semiconductor die which can be mounted either through flip-chip mounting or wirebonding and includes:
      a plurality of first contact sites configured to lie underneath said semiconductor die when said semiconductor die is proximate said die receiving member; and
      a plurality of second contact sites configured to lie adjacent said semiconductor die when said semiconductor die is proximate said die receiving member, each first contact site of said plurality of first contact sites being in electrical connection with an ahjacent second contact site of said plurality of second contact sites;

providing said semiconductor die, wherein said semiconductor die includes a first face, an opposite second face, and a plurality of bond pads on said first face capable of flip-chip mounting or wirebonding;

wirebonding said semiconductor die onto said semiconductor die receiving member in an orientation wherein each of said bond pads is in electrical connection with a second contact site of said plurality of second contact sites, wherein said wirebonding comprises:

disposing said second face proximate said die receiving member;

electrically connecting each of said plurality of bond pads with a corresponding second contact site of said plurality of second contact sites using wiring; and prior to disposing said second face proximate said die receiving member, providing an adhesive layer on said die receiving member; and placing said semiconductor die receiving member in electrical connection with a motherboard.

14. A process for providing electrical connection between a semiconductor die and a semiconductor die receiving member, said process comprising:

providing a semiconductor die having a first face, a second face opposite said first face, a periphery, and a plurality of bond pads arrayed on said first face capable of flip-chip mounting or wirebonding;

providing a semiconductor die receiving member capable of receiving a respective semiconductor die which can be mounted either through flip-chip mounting or wirebonding and including:

a die receiving surface having a die receiving region bounded by a perimeter which corresponds to and is defined by said periphery of said semiconductor die, said die receiving region being configured so as to receive said semiconductor die;

a package mount surface;

a plurality of first contact sites positioned on said die receiving surface substantially within said perimeter, each of said first contact sites corresponding to one of said bond pads;

a plurality of second contact sites positioned on said die receiving surface substantially outside said perimeter, each of said second contact sites corresponding to one of said bond pads;

a plurality of terminal contact sites on said package mount surface; and a plurality of electrically conductive traces, each electrically conductive trace corresponding to one of said terminal contact sites, one of said first contact sites, and one of said second contact sites which is adjacent to said one of said first contact sites, and providing electrical connection therebetween; and mounting said semiconductor die onto said die receiving region, said semiconductor die being mounted according to one of:

a flip-chip mounting process including:

disposing said first face onto said die receiving region;

electrically connecting each bond pad to said first contact site that corresponds thereto, wherein a conductive material is interposed between each bond pad and said second contact site that corresponds thereto; and applying an adhesive underfill between said first face and said die receiving region; and a wirebonding second mounting process including:

disposing said second face onto said die receiving region; and electrically connecting each bond pad to said first contact site that corresponds thereto;

providing a mounting substrate having a plurality of contact pads; and mounting said semiconductor die receiving member over said mounting substrate, including:

positioning said semiconductor die receiving member over said mounting substrate such that said package mount surface is disposed over said mounting substrate, wherein said semiconductor die receiving member is aligned such that said die receiving surface is substantially orthogonal to said mounting substrate; and establishing electrical connection between each of said terminal contact sites and one of said contact pads that corresponds thereto.

* * * * *

UNITED STATES PATENT AND TRADEMARK OFFICE
CERTIFICATE OF CORRECTION

PATENT NO. : 6,331,221 B1
DATED : December 18, 2001
INVENTOR(S) : Chad Cobbley

It is certified that error appears in the above-identified patent and that said Letters Patent is hereby corrected as shown below:

Column 6,
Line 7, after "the" change "a real" to -- areal --

Column 9,
Line 33, change "region" to -- member --

Column 10,
Line 21, change "first" to -- second --

Column 11,
Line 3, after "with an" change "ahjacent" to -- adjacent --

Column 12,
Line 22, change "second" to -- first --
Line 26, after "a wirebonding" delete [second mounting]
Line 29, change "first" to -- second --

Signed and Sealed this

Sixth Day of August, 2002

*Attest:*

JAMES E. ROGAN
*Director of the United States Patent and Trademark Office*

*Attesting Officer*